United States Patent
Chen et al.

(10) Patent No.: US 8,610,236 B2
(45) Date of Patent: Dec. 17, 2013

(54) EDGE DEVICES LAYOUT FOR IMPROVED PERFORMANCE

(75) Inventors: Yen-Huei Chen, Jhudong (TW); Jung-Hsuan Chen, Hsinchu (TW); Shao-Yu Chou, Chu Pei (TW); Hung-Jen Liao, Hsinchu (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 302 days.

(21) Appl. No.: 12/851,702

(22) Filed: Aug. 6, 2010

(65) Prior Publication Data

US 2012/0032293 A1 Feb. 9, 2012

(51) Int. Cl.
*H01L 27/08* (2006.01)
(52) U.S. Cl.
USPC ............... 257/499; 257/369; 257/E21.606; 257/E27.046; 257/E27.062
(58) Field of Classification Search
USPC ............ 257/369, 499, E21.606, E27.046, 257/E27.062
See application file for complete search history.

(56) References Cited

U.S. PATENT DOCUMENTS

| | | | |
|---|---|---|---|
| 6,157,067 A | | 12/2000 | Hsu et al. |
| 6,833,595 B1 * | | 12/2004 | Iwasaki .................. 257/401 |
| 2005/0009312 A1 * | | 1/2005 | Butt et al. .............. 438/587 |
| 2008/0220579 A1 | | 9/2008 | Pal et al. |
| 2009/0170270 A1 | | 7/2009 | Chakravarthi et al. |
| 2010/0052065 A1 | | 3/2010 | Diaz et al. |
| 2011/0147765 A1 * | | 6/2011 | Huang et al. ............. 257/77 |

FOREIGN PATENT DOCUMENTS

CN 101661939 A 3/2010

OTHER PUBLICATIONS

Oct. 24, 2012 office action and translation of corresponding DE10 2010 056 533.4.
Official Action issued in counterpart Chinese Patent Application No. 201010585297.4.

\* cited by examiner

*Primary Examiner* — Andy Huynh
(74) *Attorney, Agent, or Firm* — Duane Morris LLP

(57) ABSTRACT

A word line driver includes an active area having a length that extends in a first direction over a semiconductor substrate. A plurality of fingers formed over an upper surface of the active area. Each of the plurality of fingers has a length that extends in a second direction and forms a MOS transistor with a portion of the active area. A first dummy structure is disposed between an outer one of the plurality of fingers and an edge of the semiconductor substrate. The first dummy structure includes a portion that is at least partially disposed over a portion of the active area.

7 Claims, 5 Drawing Sheets

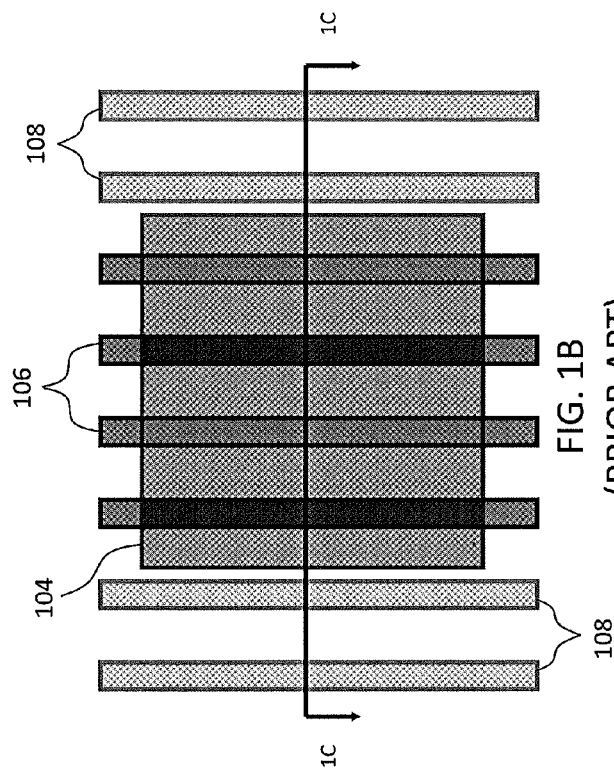
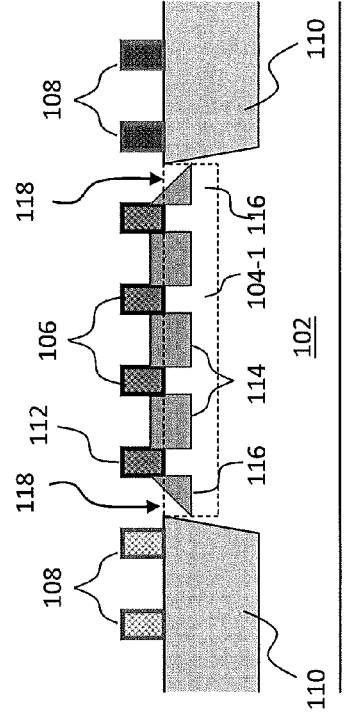
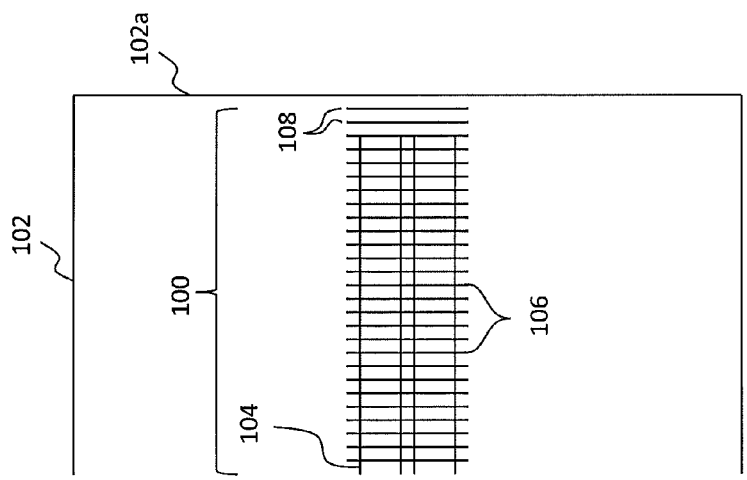
FIG. 1B (PRIOR ART)
FIG. 1C (PRIOR ART)
FIG. 1A (PRIOR ART)

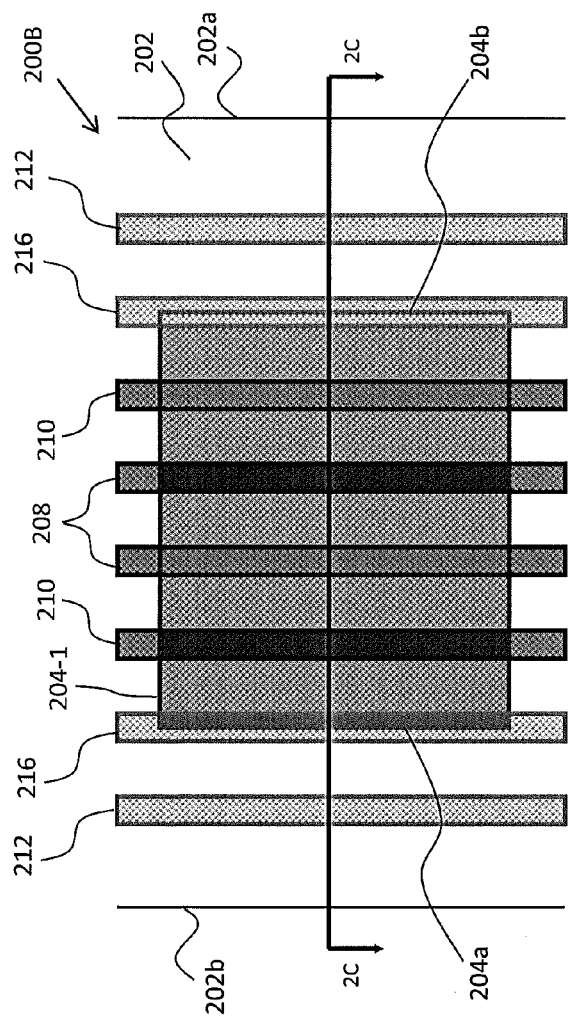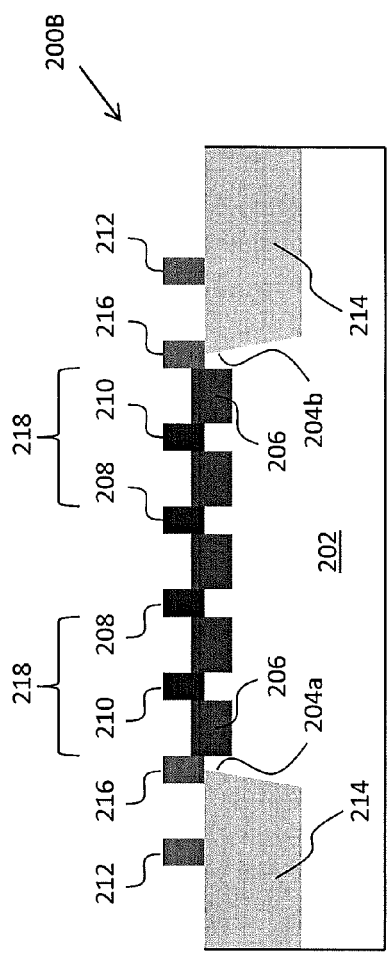

US 8,610,236 B2

EDGE DEVICES LAYOUT FOR IMPROVED PERFORMANCE

FIELD OF DISCLOSURE

The disclosed system and method relate to integrated circuits. More specifically, the disclosed system and method relate to the layout of MOS devices near an edge of an integrated circuit.

BACKGROUND

Silicon-germanium (SiGe) and silicon-carbide (SiC) processing has been considered as a performance booster for p-type metal-oxide silicon (PMOS) and n-type metal-oxide silicon (NMOS) transistors in 40 nm technology and more advanced nodes, such as 28 nm, 22 nm and 20 nm. SiGe and SiC processing is frequently used in memory arrays such as static random access memory (SRAM) arrays to boost the performance of PMOS and NMOS transistors of the word line (WL) drivers.

FIG. 1A is layout of a WL driver 100 formed on a semiconductor substrate 102. WL driver 100 includes long active areas 104-1, 104-2 (collectively referred to as "active areas 104") extending across the semiconductor chip from one edge 102a abutting a first shallow trench isolation (STI) region 110 (FIG. 1C) to an opposite edge abutting a second STI region 110. A plurality of polysilicon (poly) fingers 106 are formed over active areas 104 with each poly finger 106 respectively defining a transistor with active areas 104. For example, each poly silicon finger 106 forms the gate of a PMOS transistor with active area 104-1, which includes the source and drain regions, and each poly silicon finger 106 forms the gate of an NMOS transistor with active area 104-2, which includes the source and drain regions. A pair of dummy poly segments 108 are disposed adjacent to an edge 102a of the chip 102 over a shallow trench isolation (STI) region 110. Due to the limitations of the lithography processing, two dummy poly segments 108 are included at each edge of substrate 102 to help ensure that the active poly fingers 106 are properly formed.

However, the conventional layout of a WL driver 100 formed by a SiGe or SiC process suffers from faceting at the edges of the active areas 104 as best seen in FIG. 1C, which is a cross-sectional view of the simplified illustration of active area 104-1 shown in FIG. 1B. As shown in FIG. 1C, active area 104-1 includes a plurality of SiGe or SiC areas 114, 116 with the edge SiGe or SiC areas 116 including a facet 118, i.e., an undercut area. Facets 118 reduce the carrier mobility of the transistor formed by the source and drain regions (not shown) in active area 104-1 and poly gate 112. The reduction in carrier mobility significantly degrades the performance of the edge transistors.

Accordingly, an improved layout of an edge transistor is desirable.

SUMMARY

A word line driver is disclosed that includes an active area having a length that extends in a first direction over a semiconductor substrate. A plurality of fingers formed over an upper surface of the active area. Each of the plurality of fingers has a length that extends in a second direction and forms a MOS transistor with a portion of the active area. A first dummy structure is disposed between an outer one of the plurality of fingers and an edge of the semiconductor substrate. The first dummy structure includes a portion that is at least partially disposed over a portion of the active area.

Also disclosed is an integrated circuit that includes an active area extending in a first direction over a semiconductor substrate and having a length and a width. A plurality of spaced apart fingers are disposed over the active area. Each of the first plurality of fingers has a length that extends across the width of the active area. The first plurality of fingers form at least one gate of at least one first transistor having a source and a drain formed by a first portion of the active area. A second plurality of spaced apart fingers are disposed over the active area. Each of the second plurality of fingers has a length that extends across the width of the active area. The second plurality of fingers form at least one gate of at least one second transistor having a source and a drain formed by a second portion of the active area A first dummy polysilicon structure is disposed between an outer one of the first plurality of spaced apart fingers and a first edge of the semiconductor substrate. A portion of the first dummy polysilicon structure is disposed over the active area. A second dummy polysilicon structure is disposed between the first dummy polysilicon structure and the first edge of the semiconductor substrate.

A method is disclosed in which an active area is formed over a semiconductor substrate. The active area has a length that extends in a first direction over the semiconductor substrate. A first plurality of fingers are formed over the active area each having a length that extends in a second direction across a width of the active area. The first plurality of fingers form at least one gate of at least one transistor having a source and a drain formed by a portion of the active area. A first dummy polysilicon structure is formed over a portion of the active area such that the first dummy polysilicon structure is disposed between an outer one of the first plurality of fingers and a first edge of the semiconductor substrate. A second dummy polysilicon structure is formed over the semiconductor substrate such that the second dummy polysilicon structure is disposed between the first dummy polysilicon structure and the first edge of the semiconductor substrate.

BRIEF DESCRIPTION OF THE DRAWINGS

FIG. 1A is a partial plan view of a word line driver disposed on a semiconductor substrate.

FIG. 1B is a simplified plan view of a word line driver disposed on a semiconductor substrate.

FIG. 1C is a cross-sectional view of the word line driver illustrated in FIG. 1B taken along line 1C-1C.

FIG. 2B is a plan view of one example of an improved doped active area in accordance with the word line driver illustrated in FIG. 2A.

FIG. 2C is a cross-sectional view of the doped active area illustrated in FIG. 2B taken along line 2C-2C.

DETAILED DESCRIPTION

The inventors have discovered that the facet problem is limited to a SiGe or SiC region between an outermost poly region and an edge between the active region and the STI. By locating a dummy poly region between the outermost poly region and the STI region, the facet can be avoided, or the facet is limited to a dummy SiGe or SiC region beyond the dummy poly region (if such dummy SiGe or SiC region is provided).

An improved layout for edge devices includes a continuous, shared active area formed on a semiconductor substrate. A plurality of polysilicon (poly) segments are formed over the continuous active area to provide respective gate regions of a plurality of transistors. A first dummy poly segment is at least partially disposed over the continuous active area. The first dummy poly segment is disposed adjacent to an edge of the semiconductor substrate and extends in a substantially parallel direction with a direction in which an edge of the semiconductor substrate extends. A second dummy poly segment is disposed over a shallow trench isolation (STI) region between the first dummy poly segment and the edge of the semiconductor substrate. The improved layout provides approximately a 30 percent increase in the carrier mobility the edge transistors.

Figure 2A:
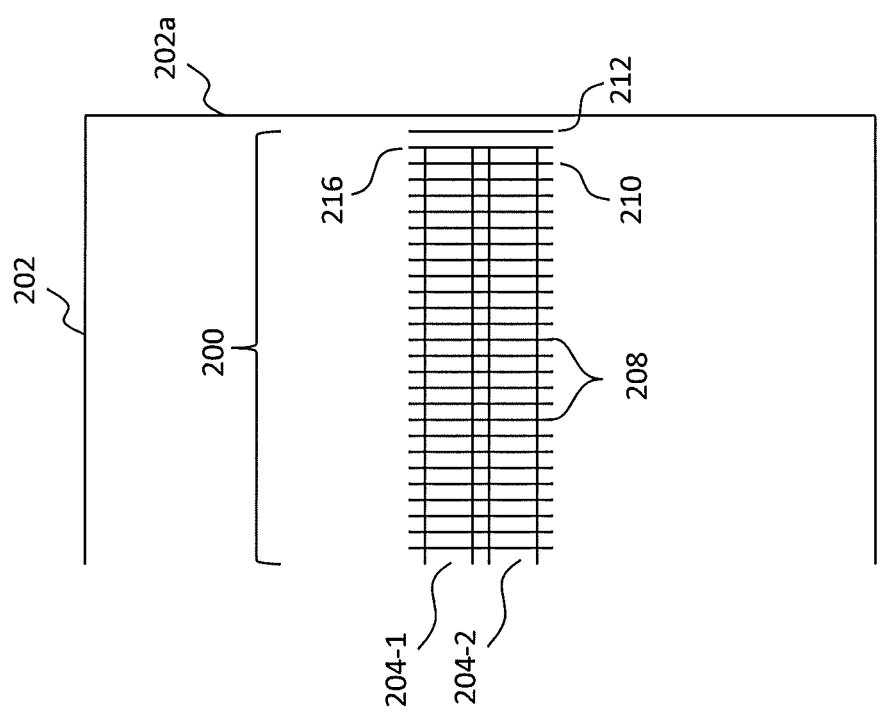
FIG. 2A is a partial plan view of an improved word line driver disposed on a semiconductor substrate.

FIG. 2A is a plan view of one example of an improved layout of a WL driver 200 extending across a semiconductor substrate 202. Semiconductor substrate 202 may be a silicon substrate as will be understood by one skilled in the art. In other embodiments, other types of semiconductor substrates may be used, such as a group IV or group III-V semiconductor, a silicon-on-insulator (SOI) semiconductor substrate, to name a few. As shown in FIG. 2A, WL driver 200 includes first and second continuous, shared active areas 204-1, 204-2 (collectively referred to as "active areas 204") and a plurality of poly fingers 208, 210 extending across the widthwise direction of active areas 204. Active area 204-1 may be doped with an n-type impurity in SiC and includes a plurality of p-type doped SiGe regions (not shown in FIG. 2A), and active area 204-1 is doped with a p-type impurity in SiGe and includes a plurality of n-type doped SiC regions (not shown in FIG. 2A). Poly fingers 208, 210 define the gate electrodes of respective PMOS and NMOS transistors with the source and drain regions being formed in the active areas 204 as will be understood by one skilled in the art. A pair of dummy poly fingers 212, 216 extend parallel to poly fingers 208, 210 and are disposed between an outermost poly finger 210 and an edge 202a of semiconductor substrate 202 with dummy poly finger 216 being disposed over at least a portion of active areas 204.

FIG. 2B is a partial plan view of an active area 204-1 of a WL driver 200A in accordance with FIG. 2A, and FIG. 2C is a cross-sectional view of the n-type or p-type doped active area 204-1 taken along line 2C-2C in FIG. 2B. Active area 204-1 may be doped with impurities comprising antimony, arsenic, or phosphorus, to name a few, to create the n-type active area 204-1. As shown in FIG. 2B, active area 204-1, which includes a plurality of p-type doped silicon-germanium (SiGe) regions 206 (shown in FIG. 2C), substantially extends across semiconductor substrate 202 such that widthwise edge 204a of active area 204-1, e.g., the edge of active area 204-1 that defines the width of active area 204-1, is adjacent to an edge 202a of semiconductor substrate 202. SiGe regions 206 may be formed by creating trenches in silicon substrate 202 and then expitaxially growing SiGe regions 206 in the trenches over the semiconductor substrate 202. SiGe regions 206 are doped with p-type impurities, e.g., boron, aluminum, and gallium to name a few, to provide source and drain regions for the MOS transistors.

A plurality of spaced apart poly fingers 208, including edge poly fingers 210, are disposed over active area 204-1 and each form a respective transistor with the doped SiGe regions 206 of active area 204-1. A channel region (not shown) is defined underneath poly fingers 208, 210 between adjacent SiGe regions 206, which form the drain and source regions. The poly fingers may be formed by a high-k metal gate process as will be understood by one skilled in the art. Poly fingers 208, 210 extend over active area 204-1 in a substantially perpendicular direction with respect to the lengthwise direction in which active area 204-1 extends. Although four poly fingers 208, 210 are illustrated in FIGS. 2B and 2C, one skilled in the art will understand that fewer or more poly fingers 208, 210 may be formed over active area 204-1.

Whereas, the poly fingers 208 are positioned between pairs of SiGe regions 206, entirely within active region 204-1, the dummy poly structures 212, 216 may partly or entirely overlie the STI regions 214, so long as at least one dummy structure at least partially overlies the active region 204-1. Dummy poly structures 212 are disposed entirely over STI regions 214 and extend parallel to the edges 202a, 202b of semiconductor substrate 202. STI regions 214 may be formed by etching semiconductor substrate 202 to provide trenches, which are then filled with a dielectric material such as, for example, silicon dioxide. Excess silicon dioxide may be removed through a chemical mechanical planarization (CMP) process as will be understood by one skilled in the art. Dummy poly structures 216 are disposed between dummy structures 212 and the outermost poly finger 210. Dummy poly structures 216 are disposed partially over a portion of active area 204-1 and partially over a portion of STI region 214. As best seen in FIG. 2C, the SiGe or SiC regions 206 adjacent to the outermost poly fingers 210 of active area 204-1 do not include a facet, which advantageously provides improved carrier mobility and conductivity of edge transistors 218 formed from active area 204-1 and an outermost poly finger 210.

Figure 2D:
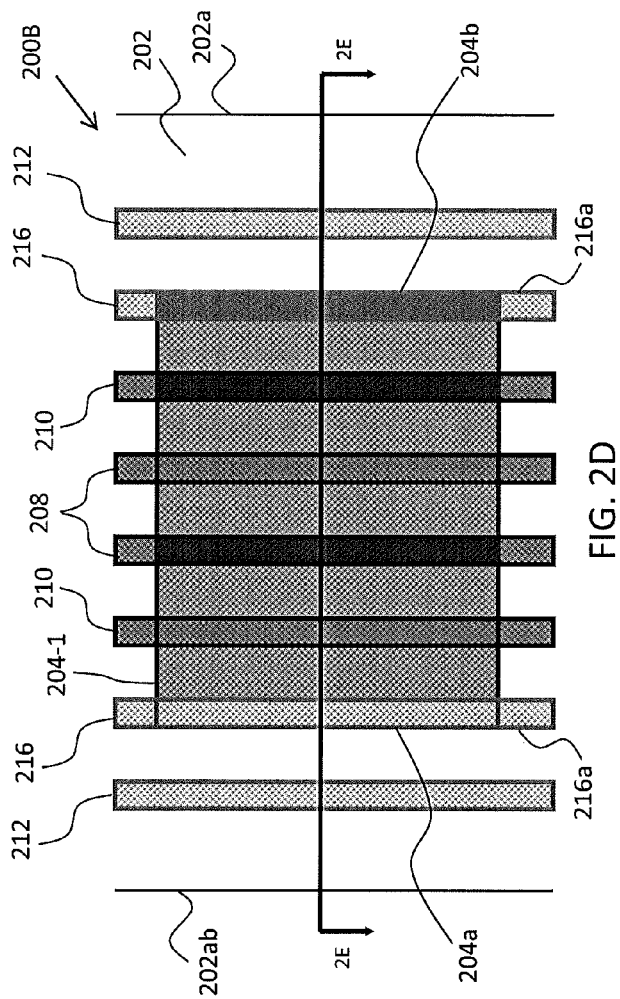
FIG. 2D is a plan view of another example of an improved doped active area in accordance with the word line driver illustrated in FIG. 2A.
Figure 2E:
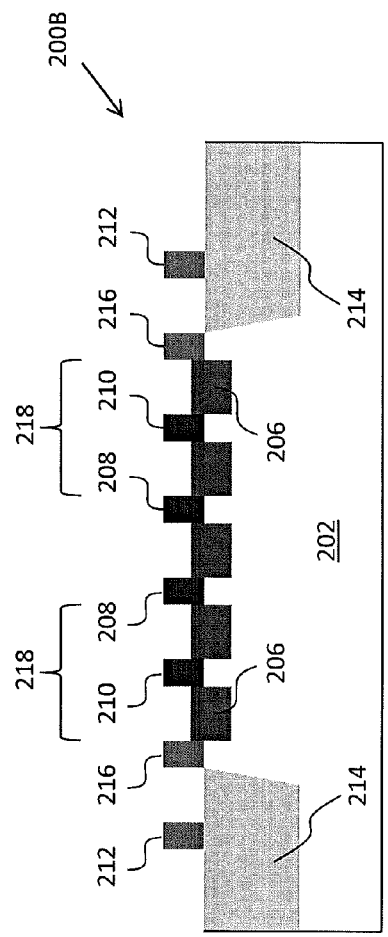
FIG. 2E is a cross-sectional view of the doped active area illustrated in FIG. 2D taken along line 2E-2E.

FIGS. 2D and 2E illustrate another partial layout view of an active area 204-1 of a WL driver 200B formed over a semiconductor substrate 202. The layout of WL driver 200B is similar to the layout shown in FIGS. 2B and 2C except that edges 204a and 204b of active area 204 extend to the outer edges 216a of inner dummy poly structure 216. The layout illustrated in FIGS. 2D and 2E increases the alignment tolerance of the poly regions 210-216 and the active region 204-1 due to the increased size of the active region compared to the layout illustrated in FIGS. 2B-2C. The descriptions of the features of WL driver 200B that are the same as features of WL driver 200A are not repeated.

Figure 2F:
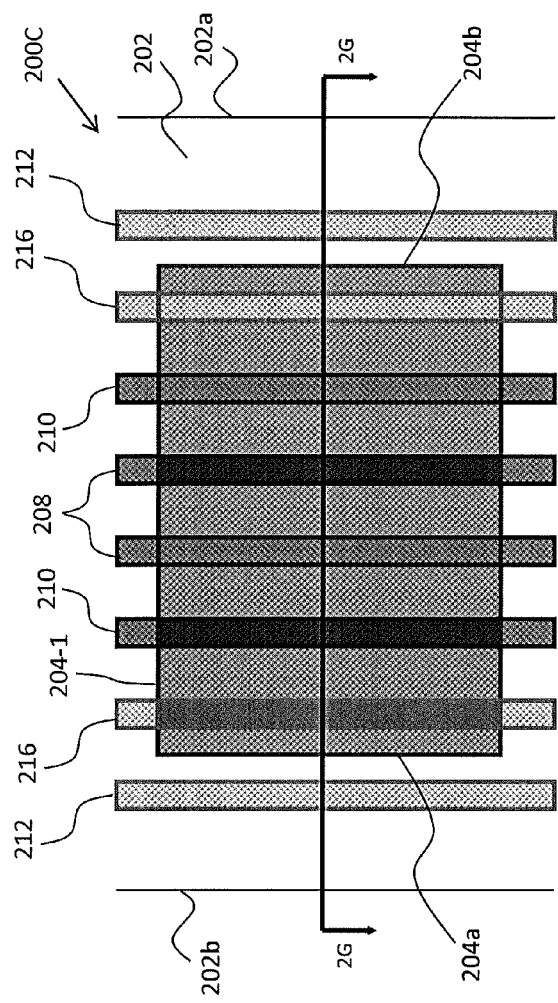
FIG. 2F is a plan view of another example of an improved doped active area in accordance with the word line driver illustrated in FIG. 2A.
Figure 2G:
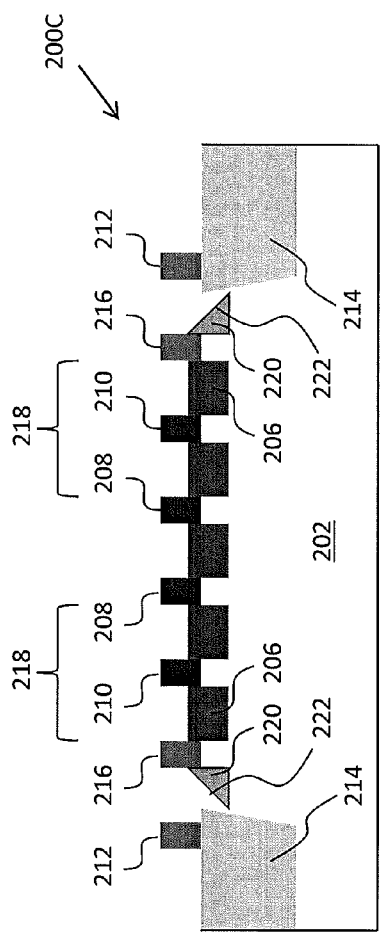
FIG. 2G is a cross-sectional view of the doped active area illustrated in FIG. 2F taken along line 2G-2G.

FIGS. 2F and 2G illustrate yet another partial layout of an active area 204-1 of a WL driver 200C formed over a semiconductor substrate 202. The layout of WL driver 200C is similar to the layout shown in FIGS. 2B and 2C except that edges 204a and 204b of active area 204 extend beyond the outer edges 216a of inner dummy poly structures 216. As best seen in FIG. 2G, dummy SiGe or SiC regions 220 adjacent to inner dummy poly segments 216 each have a facet 222. However, facets 222 do not affect the performance of edge transistors 218 formed by active area 204 and outer poly finger 210 since facets 222 are disposed in dummy SiGe regions adjacent to dummy poly segments 216. The layout illustrated in FIGS. 2F and 2G increases the alignment tolerance of the poly regions 210-216 and the active region 204-1 due to the increased size of the active region compared to the layouts illustrated in FIGS. 2B-2E.

While the improved layouts have been described with respect to a p-type doped active area 204-1 of a word line driver, one skilled in the art will understand that the methods may be applied to n-type doped active areas as well as to other devices that include a shared active area and a plurality of fingers formed adjacent to an edge of a semiconductor substrate. Extending a shared active area such that it extends at least partially beneath a dummy poly structure advantageously improves the carrier mobility of the edge devices compared to conventional methods as faceting of the SiGe regions are avoided. Consequently, the carrier mobility of these edge transistors may be increased by approximately 30 percent compared to conventional edge devices having facets.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An integrated circuit, comprising:
   an active area having a length and width that extend across a semiconductor substrate in different directions, and the active area being bounded by and disposed entirely between a shallow trench isolation region formed in the semiconductor substrate;
   a first plurality of spaced apart fingers disposed over the active area, each of the first plurality of fingers having a length that extends across the width of the active area, the first plurality of fingers forming at least one gate of at least one first transistor having a source and a drain formed by a first portion of the active area;
   a second plurality of spaced apart fingers disposed over the active area, each of the second plurality of fingers having a length that extends across the width of the active area, the second plurality of fingers forming at least one gate of at least one second transistor having a source and a drain formed by a second portion of the active area;
   a first dummy polysilicon structure disposed between an outer one of the first plurality of spaced apart fingers and a first edge of the semiconductor substrate, a portion of the first dummy polysilicon structure disposed over the active area;
   a second dummy polysilicon structure disposed between the first dummy polysilicon structure and the first edge of the semiconductor substrate
   a third dummy polysilicon structure disposed between a second outer one of the plurality of spaced apart fingers and a second edge of the semiconductor substrate, a portion of the third dummy polysilicon structure disposed over the active area; and
   a fourth dummy polysilicon structure disposed between the third dummy polysilicon structure and the second edge of the semiconductor substrate.

2. The integrated circuit of claim 1, wherein the portion of the first dummy polysilicon structure has a width that is less than a width of the first dummy polysilicon structure.

3. The integrated circuit of claim 1, wherein the portion of the first dummy polysilicon structure has a width that is equal to a width of the first dummy polysilicon structure.

4. The integrated circuit of claim 3, wherein a widthwise edge of the active area is disposed between an outer lengthwise edge of the first dummy polysilicon structure and an inner lengthwise edge of the second dummy polysilicon structure.

5. The integrated circuit of claim 1, wherein the portion of the third dummy polysilicon structure has a width that is less than a width of the third dummy polysilicon structure.

6. The integrated circuit of claim 1, wherein the portion of the third dummy polysilicon structure has a width that is equal to a width of the third dummy polysilicon structure.

7. The integrated circuit of claim 6, wherein a widthwise edge of the active area is disposed between an outer lengthwise edge of the third dummy polysilicon structure and an inner lengthwise edge of the fourth dummy polysilicon structure.

* * * * *